(12) United States Patent
Nakatani et al.

(10) Patent No.: US 8,524,094 B2
(45) Date of Patent: Sep. 3, 2013

(54) MASKING MATERIAL FOR DRY ETCHING

(75) Inventors: Isao Nakatani, Tsukuba (JP); Kimiko Mashimo, Fuchu (JP); Naoko Matsui, Fuchu (JP)

(73) Assignees: National Institute for Materials Science, Ibaraki (JP); Japan Science and Technology Corporation, Saitama (JP); Anelva Corporation, Tokyo (JP)

( * ) Notice: Subject to any disclaimer, the term of this patent is extended or adjusted under 35 U.S.C. 154(b) by 938 days.

(21) Appl. No.: 12/219,117

(22) Filed: Jul. 16, 2008

(65) Prior Publication Data

US 2008/0277377 A1  Nov. 13, 2008

Related U.S. Application Data

(63) Continuation of application No. 11/601,737, filed on Nov. 20, 2006, now abandoned, which is a continuation of application No. 09/910,854, filed on Jul. 24, 2001, now abandoned.

(30) Foreign Application Priority Data

Jul. 25, 2000  (JP) .................. 2000-224248

(51) Int. Cl.
 *B44C 1/22* (2006.01)
 *C23F 1/00* (2006.01)
(52) U.S. Cl.
 USPC ............. 216/22; 216/41; 216/58; 216/67; 29/603.01; 29/603.18
(58) Field of Classification Search
 USPC .......... 216/22, 41, 58, 67; 29/603.01, 603.18
 See application file for complete search history.

(56) References Cited

U.S. PATENT DOCUMENTS

| 3,642,548 A | | 2/1972 | Eger | |
| 4,288,283 A | * | 9/1981 | Umezaki et al. | 216/22 |
| 5,607,599 A | * | 3/1997 | Ichihara et al. | 216/22 |
| 5,705,413 A | | 1/1998 | Harkin et al. | |

(Continued)

FOREIGN PATENT DOCUMENTS

| JP | 8-253881 | 10/1996 |
| JP | 11-111701 | 4/1999 |

(Continued)

OTHER PUBLICATIONS

Nakatani, Mask for Reactive Ion Etching, Apr. 6, 1999, English-Computer translation of JP 11092971 A, 13 pages.

(Continued)

*Primary Examiner* — Shamim Ahmed
(74) *Attorney, Agent, or Firm* — Wenderoth, Lind & Ponack, L.L.P.

(57) ABSTRACT

The object of the present invention is to provide a masking material for dry etching, which is suitable for fine processing of a magnetic film as thin as a few nm such as NiFe or CoFe constituting a TMR film and capable of simplifying the process for producing a TMR element and reducing production costs related to facilities and materials. This object was solved by a masking material for dry etching of a magnetic material by using a mixed gas of carbon monoxide and a nitrogenous compound as etching gas, which comprises a metal (tantalum, tungsten, zirconium or hafnium) with a melting or boiling point increasing upon conversion thereof into a nitride or carbide.

2 Claims, 6 Drawing Sheets

(56) References Cited

U.S. PATENT DOCUMENTS

| | | | |
|---|---|---|---|
| 5,776,803 A | | 7/1998 | Young |
| 5,840,200 A | | 11/1998 | Nakagawa et al. |
| 5,946,167 A | * | 8/1999 | Hara et al. .................... 360/322 |
| 5,985,104 A | * | 11/1999 | Westwood ............... 204/192.15 |
| 5,994,235 A | | 11/1999 | O'Donnell |
| 5,997,700 A | * | 12/1999 | Fukushima et al. ..... 204/192.35 |
| 6,046,109 A | | 4/2000 | Liao et al. |
| 6,090,697 A | | 7/2000 | Xing et al. |
| 6,194,323 B1 | | 2/2001 | Downey et al. |
| 6,391,216 B1 | | 5/2002 | Nakatani |
| 6,452,385 B1 | * | 9/2002 | Shimazawa et al. .......... 324/252 |
| 6,602,620 B1 | * | 8/2003 | Kikitsu et al. ............. 428/842.2 |
| 2002/0096493 A1 | | 7/2002 | Hattori |

FOREIGN PATENT DOCUMENTS

| | | |
|---|---|---|
| JP | 11092971 | 4/1999 |
| JP | 2000-123328 | 4/2000 |
| JP | 2000-162657 | 6/2000 |
| JP | 2000-195022 | 7/2000 |

OTHER PUBLICATIONS

English translation of Notification of Refusal Reason (Official Letter) issued May 17, 2010 in Japanese Patent Application No. 2000-224248 corresponding to present U.S. application.

English translation of Notification of Refusal Reasons dated Jul. 20, 2010 in Japanese Application No. 2000-224248 corresponding to present U.S. application.

* cited by examiner

MASKING MATERIAL FOR DRY ETCHING

This application is a continuation application of Ser. No. 11/601,737, filed Nov. 20, 2006, now abandoned, which is a continuation application of Ser. No. 09/910,854, filed Jul. 24, 2001, now abandoned.

BACKGROUND OF THE INVENTION

1. Field of the Invention

The present invention relates to a masking material for etching which is used in a process for etching of magnetic materials such as Ni, Fe, Co, etc. In particular, the present invention relates to a new masking material for dry etching, useful for production of magnetic heads, integrated magnetic memories, etc. used for writing on magnetic disks. The present invention especially relates to a masking material used for fine processing by dry etching of a magnetic multi-layer film constituting magnetoresistive elements such as GMR (gigantic magnetoresistance), TMR (tunneling magnetoresistance), etc.

2. Description of the Related Art

TMR (tunneling magnetoresistive) film composed of a laminate of non-magnetic or magnetic film having a few nm thick has been mainly used for magnetic heads and MRAM (magnetic random access memory). Magnetic heads and MRAM are integrated magnetic memory attracting attention as a memory having integration density comparable to that of DRAM and high speed comparable to that of SRAM and capable of unlimited re-writing.

Up to now there are few proposals on masking materials for dry etching which are suitable for fine processing of a magnetic film of a few nm, for example on NiFe and CoFe constituting the TMR film.

JP-A 11-92971 (un-examined patent publication in Japan) proposes a mask composed of a member selected from the group consisting of titanium, magnesium, aluminum, germanium, platinum and palladium, or at least one compound or alloy based on two or more metals described above, as a mask for reactive ion etching by plasma using a mixed gas of carbon monoxide and a nitrogenous compound. However, JP-A 11-92971 did not refer to a selective ratio which is important as etching property. Also, JP-A 11-92971 has not studied about optimum masking materials taking the whole production process of TMR element, etc. into consideration.

SUMMARY OF THE INVENTION

An object of the present invention is to propose a masking material for dry etching which is suitable for fine processing of a magnetic film as thin as a few nm thick such as NiFe or CoFe constituting a TMR film. Another object of the present invention is to propose a masking material for dry etching as the before described and being capable of simplifying the process for producing a TMR element and reducing production costs related to facilities and materials.

One technique of dry etching called RIE (reactive ion etching) used widely at present as means of fine processing in the process for producing semiconductors involves applying an electric field to a material to be processed in etching-gas plasma, to cause both chemical and physical actions thereby etching a specific material only.

It is believed that etching proceeds in principle due to physical action such as vaporization action and sputtering action caused by ions vertically incident on the surface of a target material not covered with a mask and by the chemical action of chemically active species such as etching-gas ions and radicals generated in plasma which are bombarded against and adsorbed onto the surface of a target material thereby chemically reacting with the target material to form a surface reaction layer having low bonding energy thus permitting the resulting highly volatile product to be released.

The inventors of the present invention advanced their study using Ti proposed in JP-A 11-92971 as the most preferable material, and they found that the dry etching of the present invention is considered that it proceeds mainly due to sputtering.

Figure 1:
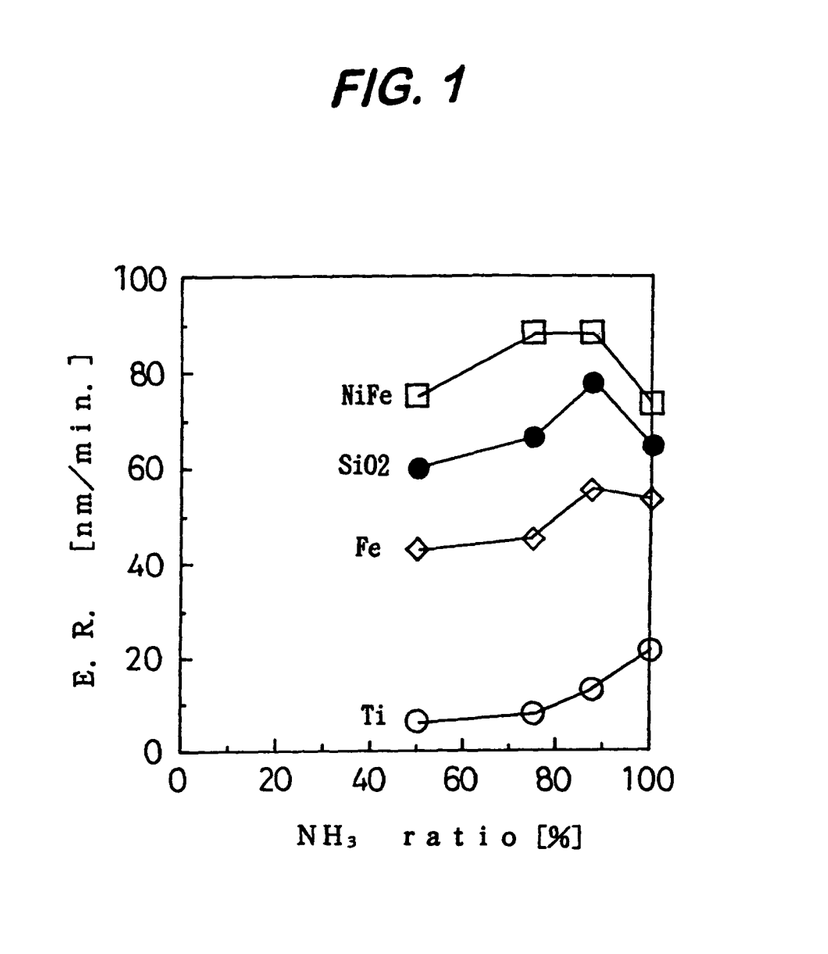
FIG. 1 is a graph showing the experimental result of etching rate in a mixed gas of carbon monoxide and a nitrogenous compound ($NH_3$).

It is considered generally difficult to increase the selective ratio of a magnetic material such as NiFe or Fe to a mask (that is, the ratio of the etching rate of the magnetic material to the etching rate of the mask) while maintaining the etching speed. But by using a mixed gas of carbon monoxide and a nitrogenous compound as the etching gas and Ti as the masking material, the etching rate of Ti can specifically be decreased while increasing the selective ratio of the magnetic material (FIG. 1).

The inventors of the present invention further advanced this study, and as a result they found that the result described above is brought about by the synergism of the following two effects.

The first effect is due to the difference in the sputtering yield between the magnetic material to be etched and Ti (titanium).

It is known that the sputtering yield of Ti is generally lower than that of a magnetic metal such as Co, Fe or Ni. For example, the sputtering yield by Ar ion at 500 eV is 0.51 for Ti, which is lower than 1.2 for Co, 1.1 or 0.84 for Fe, and 1.45 or 1.33 for Ni.

That is, the first possible reason that the selective ratio of Ti can specifically be increased in dry etching where the sputtering action is considered as dominant as described above is that the sputtering yield of Ti is lower than that of other magnetic metals.

It is therefore important in dry etching where the sputtering action is considered as dominant as the before described that when the material to be etched is a magnetic material, a material such as Ti having a lower sputtering yield than that of the material to be etched is to be used as the masking material in order to secure a higher selective ratio.

By using a mixed gas of carbon monoxide and a nitrogenous compound as the etching gas and Ti as the masking material in etching a magnetic material, the etching rate of Ti can specifically be decreased while increasing the selective ratio of the magnetic material. This second effect bringing about the fact that Ti as the masking material is modified by a plasma mixed gas of carbon monoxide and a nitrogenous compound gas thereby attaining a more stable condition, as described below.

Figure 2:
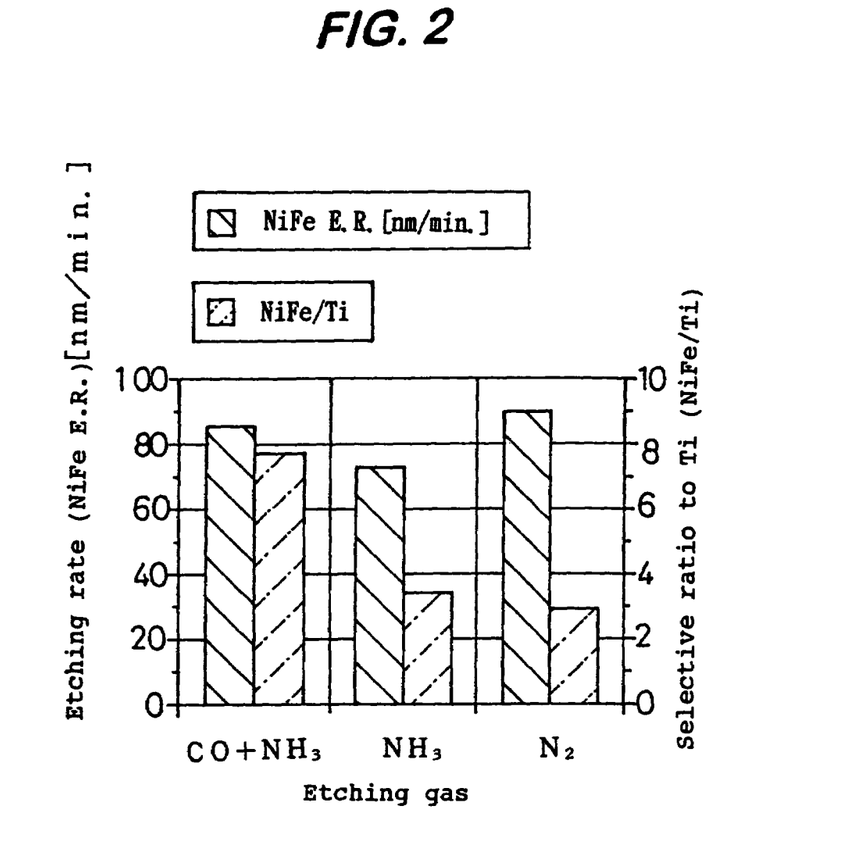
FIG. 2 is a graph showing a difference by reactive gas in NiFe etching rate and selective ratio to Ti.

The inventors of the present invention further examined the cause for the low etching rate of Ti, and as a result, they found that the etching rate can be made particularly lower in a higher selective ratio by using a mixed gas of carbon monoxide and a nitrogenous compound than by using a nitrogenous compound gas ($NH_3$ gas or $N_2$ gas) only as the etching gas, as shown in FIG. 2.

It was further found from the experimental results shown in FIGS. 1 and 2. As the ratio of $NH_3$ gas is increased, that is, as the ratio of Co gas in a mixed gas of carbon monoxide and a nitrogenous compound is decreased, the selective ratio of each etched material to Ti is decreased (FIG. 1). Only $NH_3$ or $N_2$ gas, namely absolutely free of carbon monoxide (CO gas), the selective ratio of the etched material to Ti is lower (FIG. 2).

That is, the possible reason of higher selective ratio to Ti in the mixed gas of carbon monoxide and a nitrogenous compound as the etching gas is that, as carbon monoxide (CO gas) is increased, the etching rate of Ti as compared with the magnetic material NiFe is decreased.

The experiment of inventors of the present invention reveals that the etching rate of $SiO_2$ shows behavior similar to that of the magnetic film of NiFe or Fe under the condition of similar incident-ion energy, for example under the condition where the experimental results in FIG. 1 were obtained. This also suggests that the reason of higher selective ratio to Ti in the mixed gas of carbon monoxide and a nitrogenous compound is not by a significantly high etching rate of the magnetic material but by a lower etching rate of Ti in the mixed gas of carbon monoxide and a nitrogenous compound.

Therefore, the inventors of the present invention estimated that the higher selective ratio of the etched material to Ti in the mixed gas of carbon monoxide and a nitrogenous compound is due to modification of the surface of Ti. They conducted the XPS (X-ray photoelectron spectroscopy) analysis in the depth direction of a Ti film after dry etching treatment with a mixed gas of carbon monoxide and a nitrogenous compound as the etching gas. As a result, it can be confirmed that the surface of Ti film after etching treatment is nitrided to a depth of about several nm at high concentration, and the film is carbonized as a whole.

That is, it was considered that the decline of etching rate of a Ti film in the mixed gas of carbon monoxide and a nitrogenous compound as the etching gas is attributable to both carbonization and nitriding of Ti used as the masking material, the etching gas as a mixed gas of carbon monoxide and a nitrogenous compound in the state of plasma, the Ti film as the masking material is converted into a nitride or carbide, and become chemically or structurally more stable, thus further decreasing the sputtering yield.

Accordingly, the inventors of the present invention attracted their attention to melting or boiling point related to atomic energy as a physical property indicative of chemical or structural stability upon conversion into nitride or carbide, besides the property of a lower sputtering yield as described by the above-mentioned Ti as compared with a material to be etched. They estimated another condition for achieving higher selective ratios is that the masking material should be a metallic material in the group IV to VI metals in the periodic table and the melting or boiling point gets raising when it is converted the form of single metal into nitride or carbide. Thus, this invention was thereby completed.

According to the present invention, there can be provided a masking material for dry etching, which is suitable for fine processing of a magnetic film as thin as a few nm such as NiFe or CoFe constituting a TMR film. And according to the masking material for dry etching of the present invention, the process for producing a TMR element can be simplified and production costs related to facilities and materials can be reduced.

BRIEF DESCRIPTION OF THE DRAWINGS

FIG. 6(a) to FIG. 6(c) are drawings showing the process for etching of a TMR element with Ta mask of the present invention, wherein:

DESCRIPTION OF THE PREFERRED EMBODIMENTS

A masking material for dry etching proposed in the present invention is a masking material, which is used for dry etching of a magnetic material with a mixed gas of carbon monoxide and a nitrogenous compound as etching gas, comprising a metal having a specific physical property that the melting or boiling point gets raising when it is converted the form of single metal into nitride or carbide.

Specifically, the above-mentioned metal may be tantalum (Ta), tungsten (W), zirconium (Zr) or hafnium (Hf).

As shown in Table 1 below, these metals show that the sputtering yield is lower than magnetic metals and the melting or boiling points gets raising when they are converted the form of single metal into nitrides or carbides, and these metals tend to show high selective ratios to magnetic materials such as NiFe and CoFe in dry etching where a mixed gas of carbon monoxide and a nitrogenous compound is used as the etching gas. Thus, these metals are useful as the masking material for dry etching of magnetic materials.

[Table 1]

The melting points and boiling points in Table 1 above are from "CRC Handbook of Chemistry and Physics" (Editor-in-Chief: Robert C. Weast, CRC Press, Inc. (1988)). Further, the sputtering yield are from "Fundamentals of Film Formation, 3rd edition" (Tatsuo Asamaki, The Nikkan Kogyo Shimbun Ltd.)

Among the metals described above, Ta is particularly effective for the following reason as a masking material for dry etching of magnetic materials constituting a TMR element.

Figure 3:
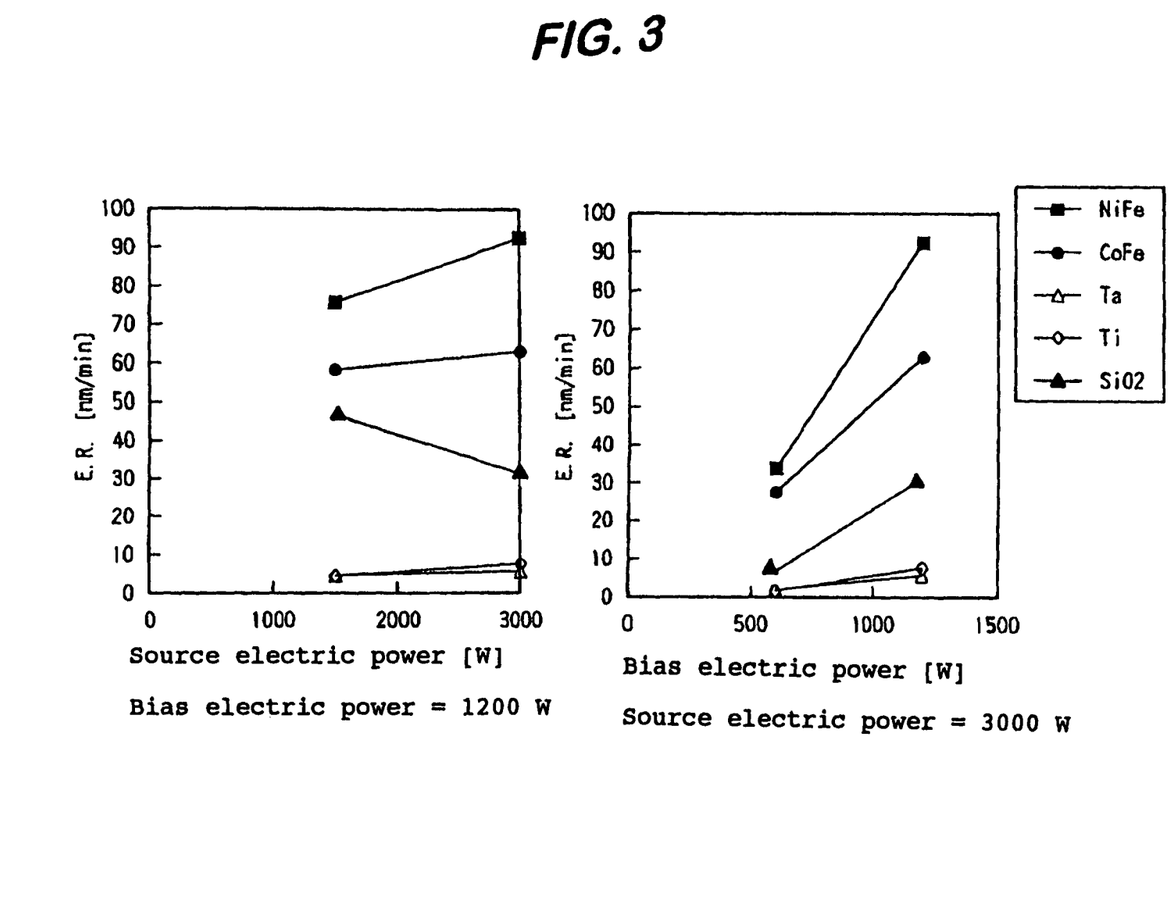
FIG. 3 is a graph showing a $CO/NH_3$ etching property of a magnetic film for TMR element.

FIG. 3 shows the measured selective ratios, to Ta, of NiFe or CoFe film constituting a magnetic film for TMR, and the selective ratio of CoFe film to Ta is 10-fold or more, so it can be confirmed that Ta can be used as a masking material for etching of magnetic materials such as NiFe film, CoFe film, etc.

On the other hand, the magnetic film constituting a TMR element has an electroconductive nonmagnetic film called a protective film formed thereon in order to prevent characteristics of the element from being deteriorated owing to oxidation and to secure chemical stability etc. And usually this protective film makes use of Ta. The reason that Ta is used as a protective film is that Ta is stable as a protective film, and also that when the Ta film is used as a sublayer, a magnetic film of NiFe or the like laminated thereon having an important role as the element will grow on a preferable orientation face.

By using Ta as the masking material for dry etching proposed in this invention, Ta formed as the protective film for TMR element has been used as the mask in the process for fine processing of a TMR element, so that after fine processing of a TMR element, it is not necessary to remove the mask, and this mask can be left as such for use as the protective layer.

That is, when Ta also serving as a sublayer necessary for forming an excellent magnetic film is used as the mask material for dry etching proposed in this invention, Ta used in the mask acts as a component (protective film) for TMR element, so that the step of removing the mask after etching is unnecessary, thus leading to shortening and simplification of the production process, and further it is not necessary to eliminate separate preparation of another material for mask, thus the costs for facilities and materials can be reduced.

In the above description, a third gas such as argon (Ar), helium (He), xenon (Xe), krypton (Kr), neon (Ne) or the like can be added as a gas to be added to the mixed gas of carbon monoxide and a nitrogenous compound used as the reactive gas. By adding the third gas, the mixed gas of carbon monoxide and a nitrogenous compound can be diluted to control excessive dissociation of the gas and re-dissociation and re-adhesion of the etching product.

Figure 4:
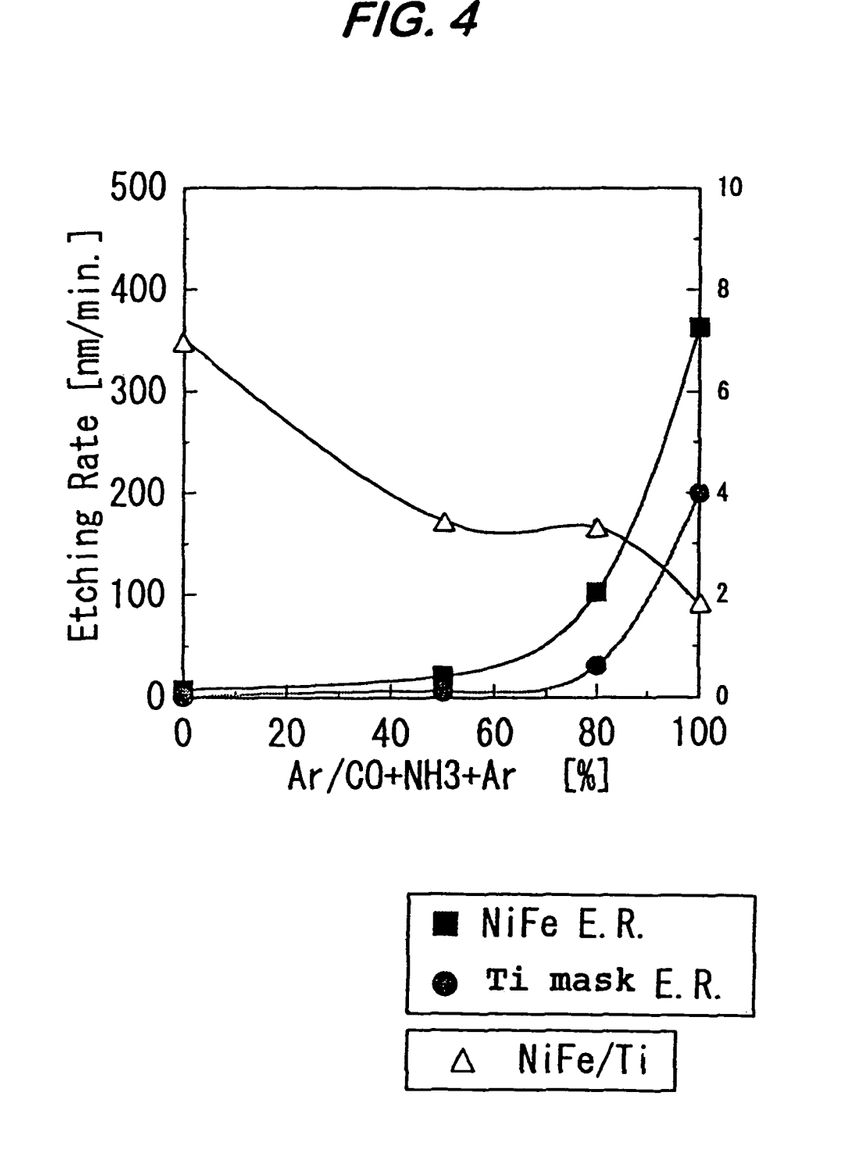
FIG. 4 is a graph showing the dependence of etching rate and selective ratio to Ti on the amount of Ar gas added.

As shown in FIG. 4, however, as the amount of Ar gas added to the mixed gas of carbon monoxide and a nitrogenous compound is increased, the selective ratio to Ti is decreased. This tendency also shows in the case of the presently adopted metal (Ta, W, Zr, Hf) having a higher melting or boiling point upon converting the form of single metal into nitride or carbide, so that the amount thereof is preferably 80% or less when the above-described third gas such as Ar gas is added to the mixed gas of carbon monoxide and a nitrogenous compound.

EXAMPLES

Figure 5:
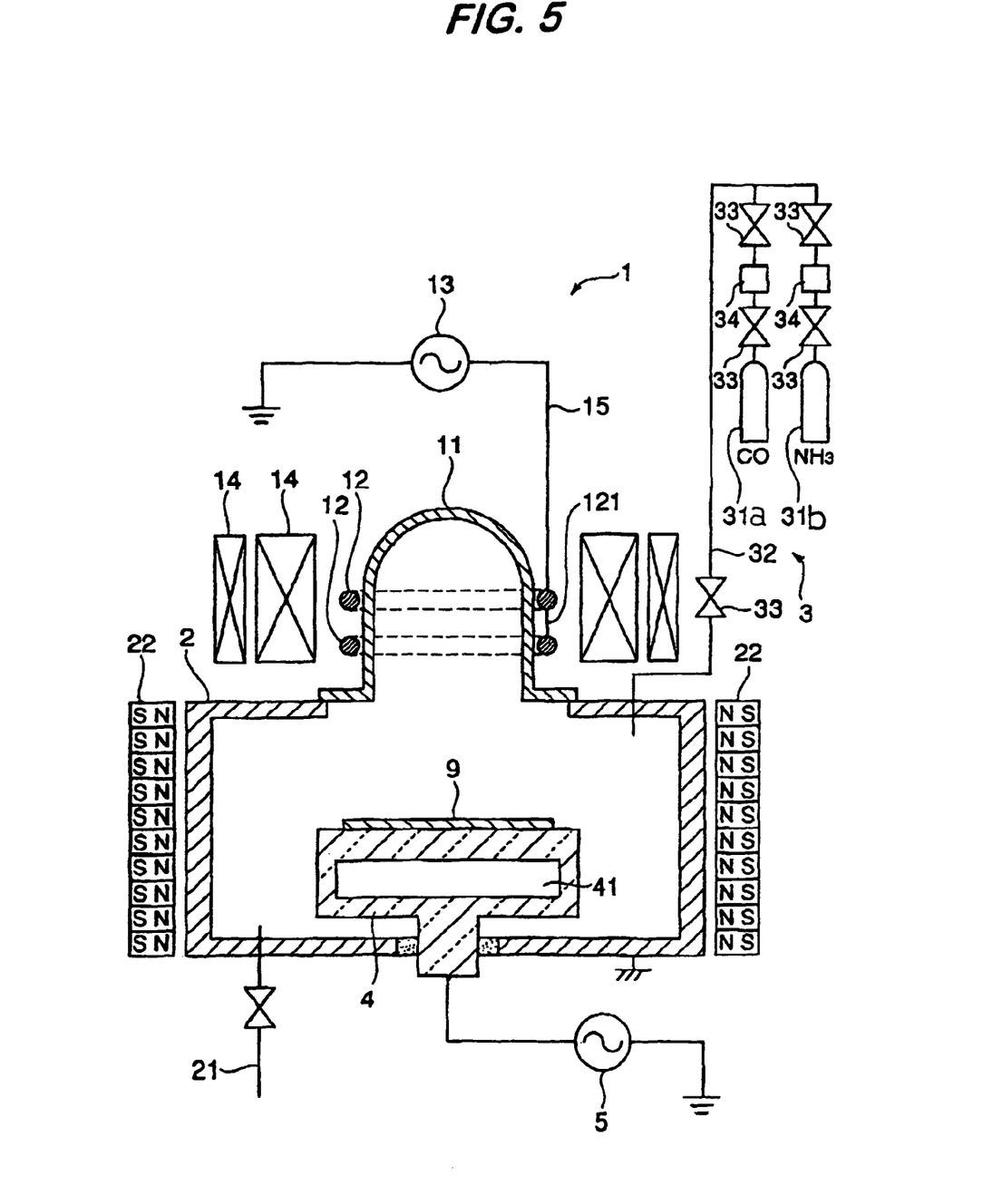
FIG. 5 is a schematic diagram showing the structure of an etching unit used for in etching a magnetic film with the Ta mask of the present invention by $CO+NH_3$ gas.

Tantalum (Ta) proposed in this invention was used as a masking material for dry etching of a magnetic material by using a mixed gas of carbon monoxide and a nitrogenous compound as etching gas, wherein etching of a TMR element was conducted using an etching unit with a helicon wave plasma source as shown in FIG. 5.

The fundamental structure of a TMR element is shown in FIG. 6.

The TMR structure featuring the TMR element comprises two ferromagnetic layers of CoFe called a pin layer (layer above $Al_2O_3$) and a free layer (layer below $Al_2O_3$) respectively (the thickness of the pin layer is 5 nm while the thickness of the free layer is 10 nm) between which an $Al_2O_3$ film of 1 nm in thickness is sandwiched as an insulating layer, and an anti-ferromagnetic layer of FeMn (thickness: 20 nm) as an upper layer on the pin layer. The description of the basic principle and working of the TMR element is omitted.

During the production process, Ta serving not only as a protective layer for TMR element but also as a mask for dry etching of magnetic layers including the insulating layer of $Al_2O_3$ is laminated as the uppermost layer in contact with the air. Ta film of 9 nm in thickness is laminated before dry etching so that the thickness of the protective layer can be secured after dry etching. Generally, the protective layer (Ta), the anti-ferromagnetic layer (FeMn), the ferromagnetic layer (CoFe) and the insulating layer ($Al_2O_3$) are formed in this order by sputtering deposition.

Figure 6A:
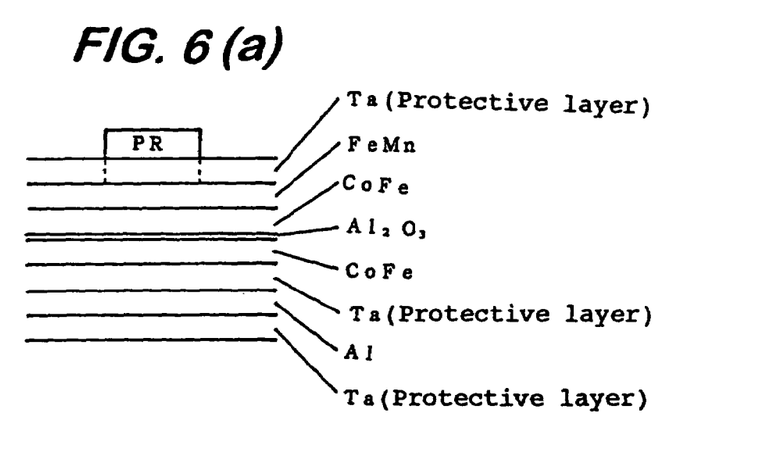
FIG. 6(a) is a schematic sectional view of the magnetic film before the process.
Figure 6B:
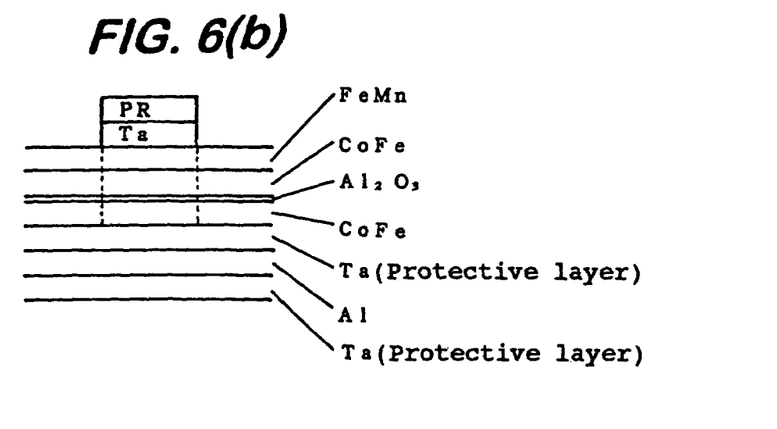
FIG. 6(b) is a schematic sectional view of the magnetic film upon etching of a Ta film with PR as the mask.

In the TMR element having the structure shown in FIG. 6(a), the Ta film with PR as the mask was first etched with $SF_6$ gas, and the Ta film formed as shown in FIG. 6(b) was used as the mask for the magnetic layers (FeMn, CoFe) including the insulating layer of $Al_2O_3$. This process was conducted as follows.

A vacuum container 2 shown in FIG. 5 is exhausted with an exhaust system 21, then a gate valve not shown in the drawing is opened, and a wafer 9 on which a TMR film serving as TMR element having the structure shown in FIG. 6(a) has been laminated is transferred to the vacuum container 2, maintained in an object holder 4 and kept at a predetermined temperature by a temperature control mechanism 41. Then, a gas-introducing system 3 is operated, and an etching gas ($SF_6$) is transferred at a predetermined flow rate from a cylinder (not shown in the drawing) for storing the $SF_6$ gas, via a piping, a valve and a flow-rate regulator (not shown in the drawing), into the vacuum container 2. The etching gas thus introduced diffuses via the vacuum container 2 into a dielectric wall container 11. Here, a plasma source 1 is operated. The plasma source 1 is composed of the dielectric wall container 11 connected air-tightly to communicate with the vacuum container 2, 2-turn antennas 12 inducing a helicon wave in the dielectric wall container 11, a plasma high-frequency power source 13 connected to the antenna 12 via a regulator (not shown in the drawing) with a transmission path 15 and generating high-frequency electric power (source electric power) supplied to the antennas 12, and electromagnets 14 for generating a predetermined magnetic field in the dielectric wall container 11, etc. When the high frequency generated by the plasma high-frequency power source 13 is supplied via the transmission path 15 to the antennas 12, electric currents flow in directions opposite to each other through the 2-turn antennas 12, and as a result, a helicon wave is induced in the inside of the dielectric wall container 11. The energy of this helicon wave is given to the etching gas, to form helicon wave plasma. The sidewall of the vacuum container 2 is provided in the outside thereof with a large number of sidewall magnets 22 in the peripheral direction thereof such that the magnetic poles of adjacent magnets facing the sidewall of the vacuum container 2 are mutually different, whereby a cusp magnetic field is formed continuously in the peripheral direction along the inner face of the sidewall of the vacuum container 2, thus preventing diffusion of the plasma into the inner face of the sidewall of the vacuum container 2. Simultaneously, the bias high-frequency power source 5 is actuated to apply a self-biased voltage i.e. a negative DC voltage to the wafer 9 as the material subjected to etching, to control the incident-ion energy from the plasma on the surface of the wafer 9. The plasma formed as described above diffuses from the dielectric wall container 11 into the vacuum container 2 to reach the surface of the wafer 9. The surface of the wafer 9 is thereby etched.

The process of etching the Ta film by PR mask using $SF_6$ as described above was conducted under the following conditions: the flow rate of the etching gas ($SF_6$) was 326 mg/min. (50 sccm); the source electric power, 1000 W; the bias electric power, 100 W; pressure in the vacuum container 2, 0.5 Pa; and the temperature of wafer 9, 50° C.

Then, a mixed gas of CO gas and $NH_3$ gas was used as the etching gas, and the magnetic film was etched using the Ta mask formed by the process described above.

Figure 6C:
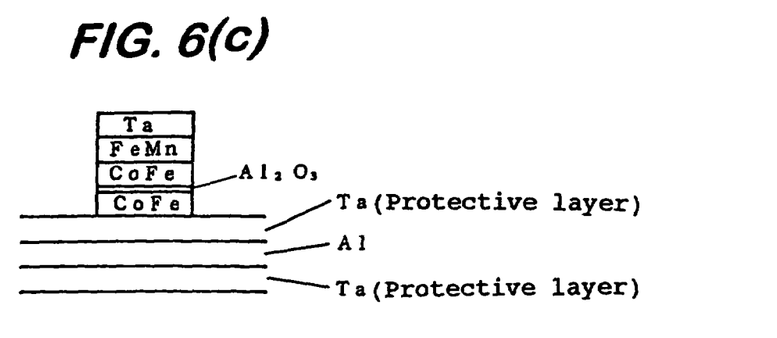
FIG. 6(c) is a schematic sectional view of the magnetic film after etched with the Ta mask.

Using the etching unit with a helicon wave plasma source shown in FIG. 5, another process was also conducted in the same manner as described above except that the process where a gas-introducing system not shown in the drawing is actuated to introduce $SF_6$ gas as the etching gas into the vacuum container 2 is changed into the process where the gas-introducing system 3 is actuated to introduce an etching gas of two gases in a predetermined ratio (mixed gas of CO gas and $NH_3$ gas) at a predetermined flow rate from a cylinder 31a for storing CO gas and a cylinder 31b for storing $NH_3$ gas which are shown in FIG. 5, via a piping 32, a valve 33 and a flow-rate regulator 34 into the vacuum container 2, followed by etching to give the TMR element shown in FIG. 6(c).

The process of etching the magnetic film by the Ta-film mask was conducted under the following conditions: the flow rate of the etching gas was 12.5 mg/min. (10 sccm) for CO gas and 22.8 mg/min. (30 sccm) for $NH_3$ gas; the source electric power, 3000 W; the bias electric power, 1200 W; the pressure in the vacuum container 2, 0.8 Pa; and the temperature of wafer 9, 100° C.

When the TMR element was etched by the process described above, no film adhering to the patterned sidewall was generated.

On the other hand, when the TMR element was etched in Ar gas with PR mask, a film adhering to the patterned sidewall was generated.

As a result, the Ta mask having etching performance (CoFe etching rate, 63.1 nm/min.; Ta etching rate, 5.7 nm/min.; and selective ratio (to CoFe), 11) which is equal to or higher than that of Ti, as shown in FIG. 3, was obtained as a masking material for dry etching of a magnetic material constituting a TMR element by using a mixed gas of carbon monoxide and a nitrogenous compound as the etching gas, and after etching, the Ta film was left as such as the protective film of 5 nm in thickness.

Further, because an adhering material to the patterned sidewall, which is attributable to reaction products generated by dry etching, can be reduced by using Ta as the masking material, it is possible to conduct etching with a larger taper angle and less adhering material to the patterned sidewall.

In the foregoing, preferable embodiments and experimental examples of the present invention are described, but the present invention is not limited to the above-described embodiments and can be carried out in various modes within the technical scope described in the claims.

For example, when the mixed gas of carbon monoxide and a nitrogenous compound is used as the etching gas and the metal such as Ta proposed in the present invention is used as the masking material for dry etching of a magnetic film constituting a TMR element, the structure of the TMR element is not limited to the structure shown in FIG. 6.

Further, the etching unit used in the above-described experimental examples was an etching unit with a helicon wave plasma source, but the etching unit is not limited thereto, and parallel plate-type RIE, magnetron RIE, ECR and ICP etc. can be used.

TABLE 1

|  | Melting point | Boiling point | Degree of sputtering (Ar ion, 500 eV) |
|---|---|---|---|
| Ti | 1660 ± 10 | 3287 | 0.51 |
| TiC | 3140 ± 90 | 4820 | — |
| TiN | 2930 | — | — |
| Ta | 2996 | 5425 ± 100 | 0.57 |
| TaC | 3880 | 5500 | — |
| TaN | 3360 ± 50 | — | — |
| W | 3410 ± 20 | 5660 | 0.57 |
| WC | 3870 ± 50 | 6000 | — |
| $WN_2$ | above 400 | — | — |

TABLE 1-continued

|  | Melting point | Boiling point | Degree of sputtering (Ar ion, 500 eV) |
|---|---|---|---|
| Zr | 1852 ± 2 | 4377 | 0.65 |
| ZrC | 3540 | 5100 | — |
| ZrN | 2980 ± 90 | — | — |
| Hf | 2227 ± 20 | 4602 | 0.70 |
| HfC | ca 3890 | — | — |
| HfN | 3305 | — | — |

What is claimed is:

1. A method for producing a tunneling magnetoresistive element having a tunneling magnetoresistive structure which comprises an insulating layer sandwiched between two ferromagnetic layers of a pin layer and a free layer, wherein the tunneling magnetoresistive structure has a protective film formed thereon, the method comprising:

forming a mask on a surface of a laminate of the tunneling magnetoresistive structure, wherein the mask comprises a tantalum metal having a specific physical property that its melting point or boiling point increases when the tantalum metal is converted into a nitride or carbide; and dry etching the laminate, the mask being formed on the surface thereof, using a mixed gas comprising carbon monoxide and a nitrogenous compound as etching gas to form the tunneling magnetoresistive structure;

wherein the mask including tantalum remains on the surface of the tunneling magnetoresistive structure after the dry etching, and the mask including tantalum is configured to be the protective film of the tunneling magnetoresistive structure after the dry etching.

2. A method for producing a tunneling magnetoresistive element having a tunneling magnetoresistive structure which comprises an insulating layer sandwiched between two ferromagnetic layers of a pin layer and a free layer, wherein the tunneling magnetoresistive structure has a protective film formed thereon, the method comprising:

forming a mask on a surface of a laminate of the tunneling magnetoresistive structure, wherein the mask comprises a tantalum metal having a specific physical property that its melting point or boiling point increases when the tantalum metal is converted into a nitride or carbide; and dry etching the laminate, the mask being formed on the surface thereof, using a mixed gas comprising carbon monoxide, a nitrogenous compound and a gas selected from the group consisting of argon, helium, xenon, krypton and neon as etching gas to form the tunneling magnetoresistive structure;

wherein the mask including tantalum remains on the surface of the tunneling magnetoresistive structure after the dry etching, and the mask including tantalum is configured to be the protective film of the tunneling magnetoresistive structure after the dry etching.

* * * * *